United States Patent [19]

Tasaka

[11] Patent Number: 5,795,814

[45] Date of Patent: Aug. 18, 1998

[54] METHOD FOR MANUFACTURING SEMICONDUCTOR DEVICE HAVING GROOVE-TYPE ISOLATION AREA

[75] Inventor: Kazuhiro Tasaka, Tokyo, Japan

[73] Assignee: NEC Corporation, Tokyo, Japan

[21] Appl. No.: 609,953

[22] Filed: Mar. 4, 1996

[30] Foreign Application Priority Data

Mar. 4, 1995 [JP] Japan .................. 7-070877

[51] Int. Cl.$^6$ .................. H01L 21/76
[52] U.S. Cl. .................. 438/424; 438/701
[58] Field of Search .................. 437/72, 62 US, 437/67, 701; 438/424, 425, 439, 444, 448

[56] References Cited

U.S. PATENT DOCUMENTS

| | | | |
|---|---|---|---|
| 4,449,287 | 5/1984 | Maas et al. | 437/67 |
| 4,868,136 | 9/1989 | Ravaglia | 437/67 |
| 5,004,703 | 4/1991 | Zdebel et al. | 437/67 |
| 5,096,848 | 3/1992 | Kawamura | 437/67 |
| 5,120,675 | 6/1992 | Pollack | 437/67 |
| 5,169,491 | 12/1992 | Doan | 156/636 |
| 5,229,316 | 7/1993 | Lee et al. | 437/67 |
| 5,231,046 | 7/1993 | Tasaka | 437/67 |
| 5,290,396 | 3/1994 | Schoeborn et al. | 156/636 |
| 5,449,314 | 9/1995 | Meikle et al. | 451/41 |

FOREIGN PATENT DOCUMENTS

| | | | |
|---|---|---|---|
| 0232748 | 8/1987 | European Pat. Off. | 437/67 |
| 4118471 | 12/1991 | Germany | 437/67 |
| 57-079642 | 5/1982 | Japan | 437/69 |
| 62-145833 | 6/1987 | Japan | 437/72 |
| 63-131538 | 6/1988 | Japan . | |
| 6-45432 | 2/1994 | Japan . | |

OTHER PUBLICATIONS

Wolf, Stanley *Silicon Processing For The VLSI Era*, vol. 1, pp. 532–534 (1986).
Wolf, Stanley *Silicon Processing For The VLSI Era*, vol. 2 pp. 32–33 (1990).

*Primary Examiner*—Charles L. Bowers, Jr.
*Assistant Examiner*—Matthew Whipple
*Attorney, Agent, or Firm*—Sughrue, Mion, Zinn Mackpeak & Seas, PLLC

[57] ABSTRACT

In a method for forming a groove-type isolation area, an insulating pattern is formed by a selective oxidation process or a LOCOS process on a semiconductor substrate. The semiconductor substrate is etched with a mask of the insulating pattern to create a groove in the semiconductor substrate. An insulating layer is buried in the groove to form the groove-type isolation area.

10 Claims, 8 Drawing Sheets

METHOD FOR MANUFACTURING SEMICONDUCTOR DEVICE HAVING GROOVE-TYPE ISOLATION AREA

BACKGROUND OF THE INVENTION

1. Field of the Invention

The present invention relates to a method for manufacturing a semiconductor device having active areas surrounded by a groove-type isolation area.

2. Description of the Related Art

Generally, in a semiconductor device, a plurality of active areas in which active elements such as transistors are formed are isolated from each other by an isolation area in which a groove is formed and an insulating layer is buried in the groove.

In a prior art method for manufacturing a semiconductor device, the above-mentioned groove is formed by isotropically etching a substrate using a photoresist mask. This will be explained later in detail.

In this prior art method, however, the width of the grooves cannot be smaller than a minimum resolution dimension determined by a photolithography technology. This is disadvantageous in terms of integration. Also, since the grooves are formed by the isotropic etching process, the shape of the grooves is unstable. As a result, the edges of the grooves are obtuse or round, and accordingly, voids may be created. At worst, the insulating layer cannot be completely buried in the grooves, and accordingly, it is impossible to reduce the size of the isolation area. This is also disadvantageous in terms of integration.

SUMMARY OF THE INVENTION

It is an object of the present invention to provide a method for forming a groove-type isolation area smaller than a minimum resolution dimension determined by a photolithography process, thus enhancing the integration.

According to the present invention, in a method for forming a groove-type isolation area, an insulating pattern is formed by a selective oxidation process on a semiconductor substrate. The semiconductor substrate is etched with a mask of the insulating pattern to create a groove in the semiconductor substrate. An insulating layer is buried in the groove to form the groove-type isolation area. Thus, the width of the groove can be smaller than the minimum resolution dimension by so-called bird beaks of the insulating pattern.

Also, for the etching of the groove, use is made of an anisotropic etching process. As a result, the shape of the groove can be stable.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art method for manufacturing a semiconductor device will be explained with reference to FIGS. 1A through 1E. In FIGS. 1A through 1E, references $A_1$, $A_2$, $A_3$ and $A_4$ designate active areas, and I designates an isolation area.

Figure 1A:
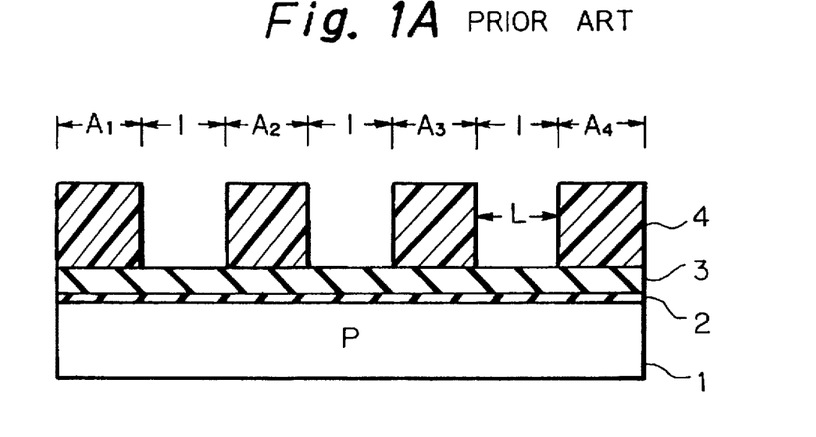
FIGS. 1A through 1E are cross-sectional views for showing a prior art method for manufacturing a semiconductor device.

First, referring to FIG. 1A, a silicon oxide layer 2 is formed by thermally oxidizing a P-type monocrystalline silicon substrate 1. Then, a silicon nitride layer 3 is formed by a chemical vapor deposition (CVD) process on the silicon oxide layer 2. Then, a photoresist layer 4 is formed on the silicon nitride layer 3, and openings for defining the isolation area I are perforated in the photoresist layer 4 by a photolithography process.

Figure 1B:
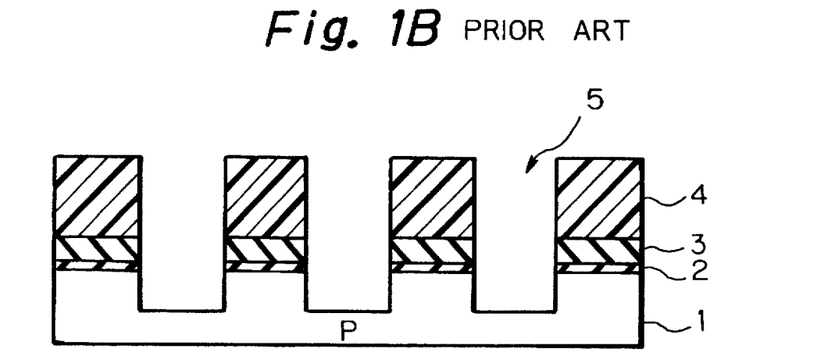

Next, referring to FIG. 1B, the silicon nitride layer 3 is etched by an anistropic etching process using the photoresist layer 4 as a mask, and subsequently, the silicon oxide layer 2 is etched by diluted fluorine acid using the photoresist layer 4 as a mask. Further, the silicon substrate 1 is etched by an isotropic etching process using $SF_6$ or the like, thus forming grooves 5. Then, the photoresist layer 4 is removed.

Figure 1C:
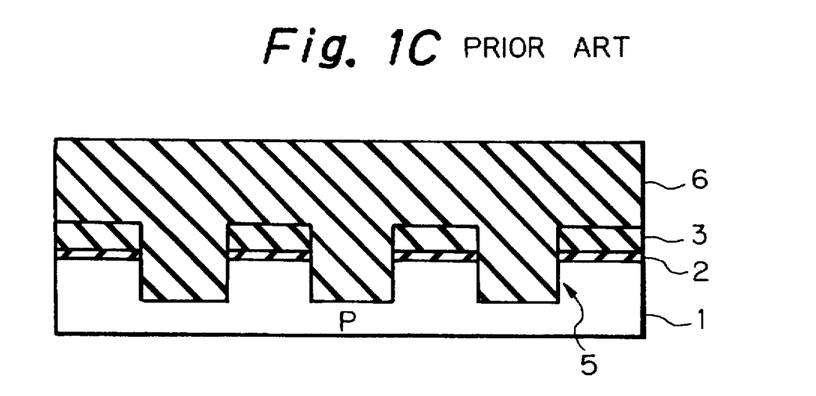

Next, referring to FIG. 1C, a boron-including phospho-silicated glass (BPSG) layer 6 is formed by a CVD process on the entire surface and is completely filled in the grooves 5. Then, the BPSG layer 6 is flattened by an annealing process.

Figure 1D:
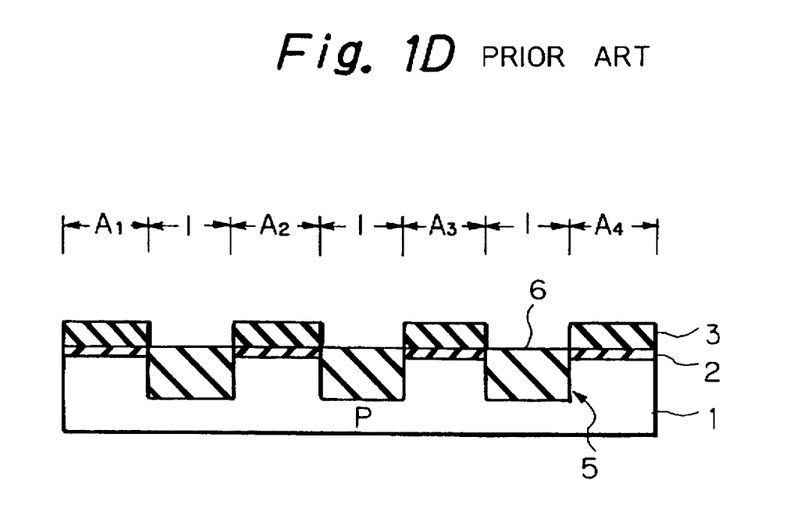

Next, referring to FIG. 1D, the BPSG layer 6 is etched back by using the silicon nitride layer 3 as an etching stopper, so that the BPSG layer 6 remains in the grooves 5.

Figure 1E:
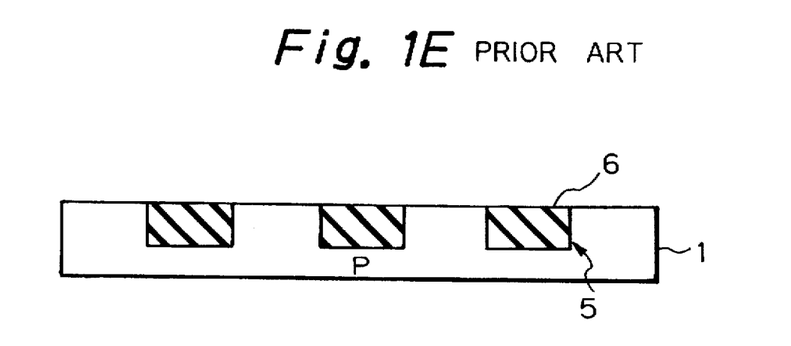

Finally, referring to FIG. 1E, the silicon nitride layer 3 and the silicon oxide layer 2 are etched, and accordingly, the BPSG layer 6 remains only in the grooves 5.

Thus, the active areas $A_1$, $A_2$, $A_3$ and $A_4$ are isolated from each other by the isolation area I in which the groove-type BPSG layer 6 is formed.

In the method as illustrated in FIGS. 1A through 1E, however, the width of the grooves 5 cannot be smaller than a minimum resolution dimension L determined by a photo-lithography technology. For example, as illustrated in FIG. 1A, if the minimum resolution dimension L of the openings of the photoresist layer 4 is 0.5 µm, the width of the grooves 5 is at least 0.5 µm. This is disadvantageous in terms of integration.

Figure 2A:
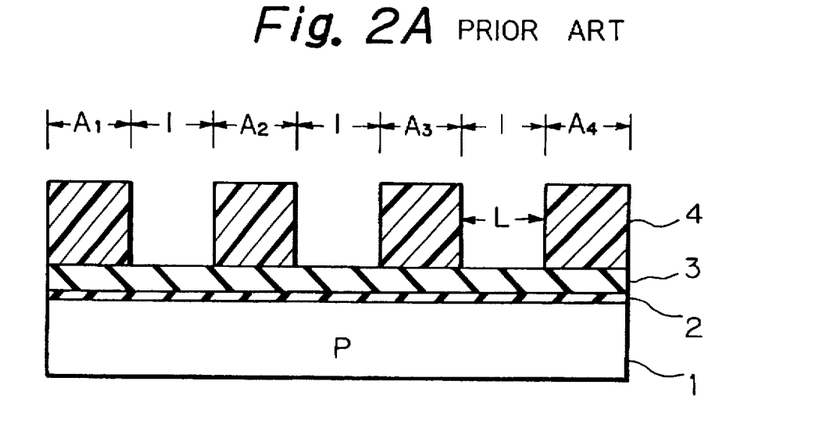
FIGS. 2A through 2E are cross-sectional views for explaining problems caused by the method shown in FIGS. 1A through 1E.
Figure 2B:
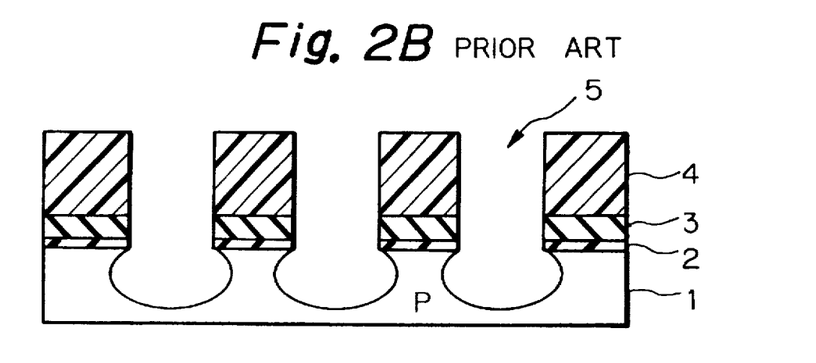
Figure 2C:
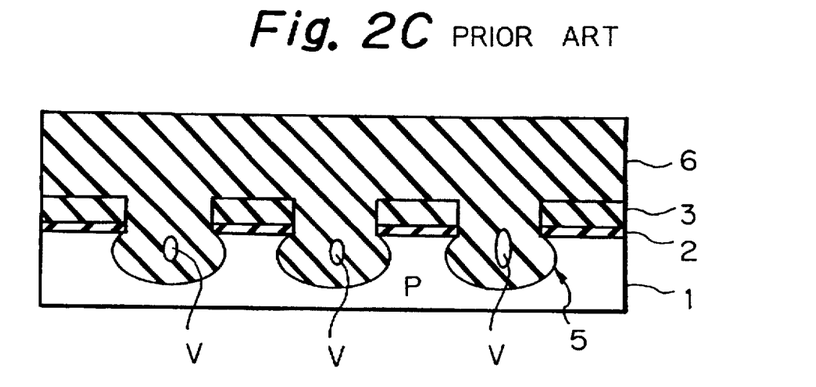
Figure 2D:
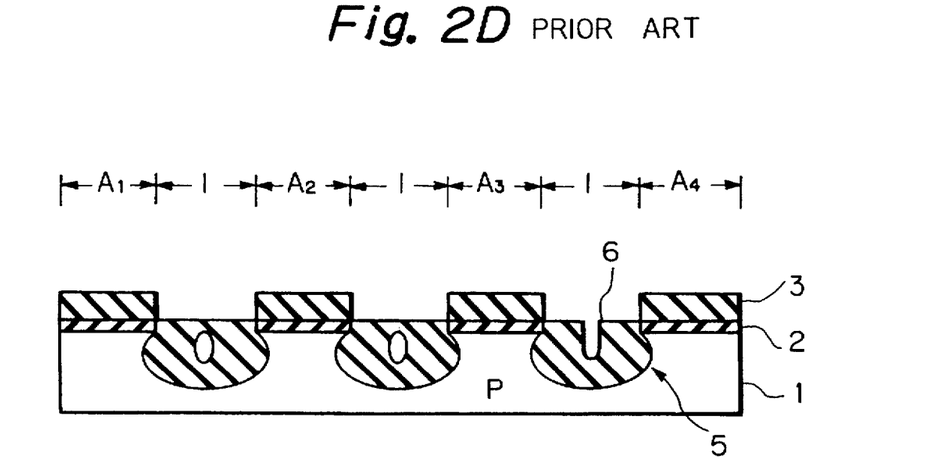
Figure 2E:
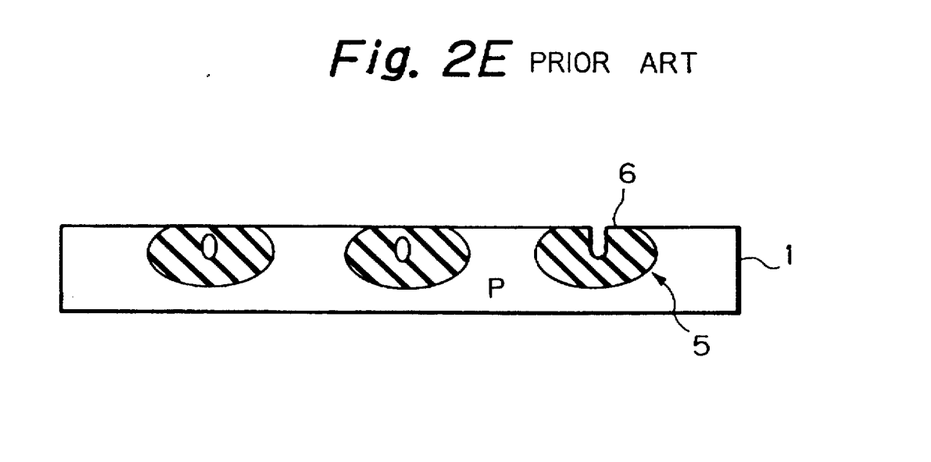

Also, since the grooves 5 are formed by the isotropic etching process, the shape of the grooves 5 is unstable. For example, as illustrated in FIGS. 2A through 2E which correspond to FIGS. 1A through 1E, respectively, the edges of the grooves 5 are obtuse or round, and as a result, voids V may be created. At worst, as illustrated in FIG. 2E, the BPSG layer 6 cannot be completely buried in the grooves 5, and accordingly, it is impossible to reduce the size of the isolation area I. This is also disadvantageous in terms of integration.

FIGS. 3A through 3I illustrate a first embodiment of the present invention. In FIGS. 3A through 3I, reference $A_1'$, $A_2'$, $A_3'$ and $A_4'$ designate active areas, and reference I 'designates an isolation area.

Figure 3A:
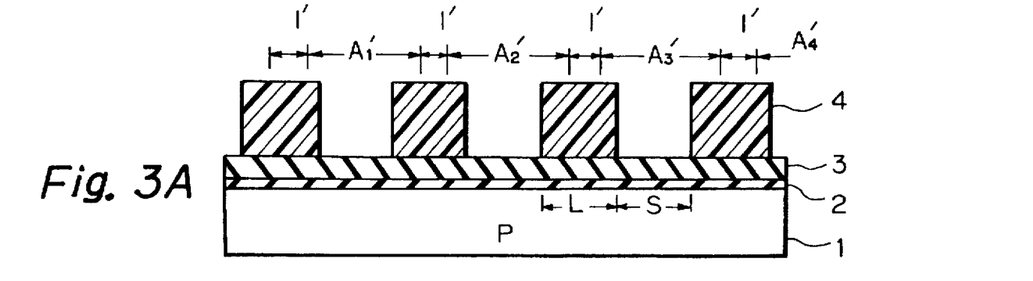
FIGS. 3A and 3I are cross-sectional views for showing a first embodiment of the method of manufacturing a semiconductor device according to the present invention.

First, referring to FIG. 3A, in a similar way to that in FIG. 1A, an about 50 to 200 Å thick silicon oxide layer 2 is formed by thermally oxidizing a P-type monocrystalline silicon substrate 1. Then, an about 0.1 to 0.3 μm thick silicon nitride layer 3 is formed by a CVD process on the silicon oxide layer 2. Then, a photoresist layer 4 is formed on the silicon nitride layer 3.

Also, as illustrated in FIG. 3A, openings for defining active areas $A_1'$, $A_2'$, $A_3'$ and $A_4'$ are perforated in the photoresist layer 4 by a photolithography process.

Figure 3B:
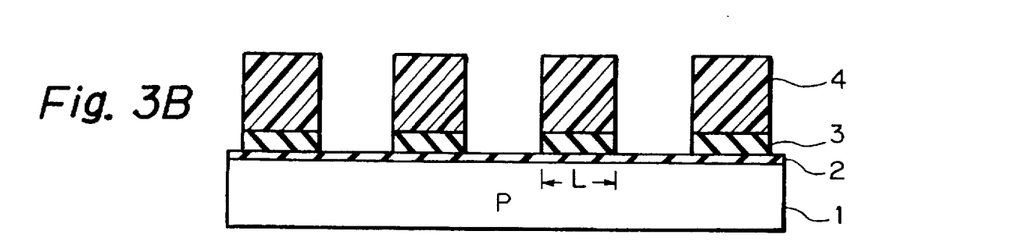

Next, referring to FIG. 3B, the silicon nitride layer 3 is etched by an anisotropic etching process using the photoresist layer 4 as a mask.

Figure 3C:
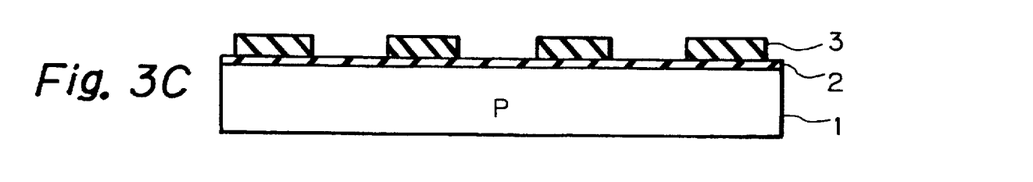

Next, referring to FIG. 3C, the photoresist layer 4 is removed.

Figure 3D:
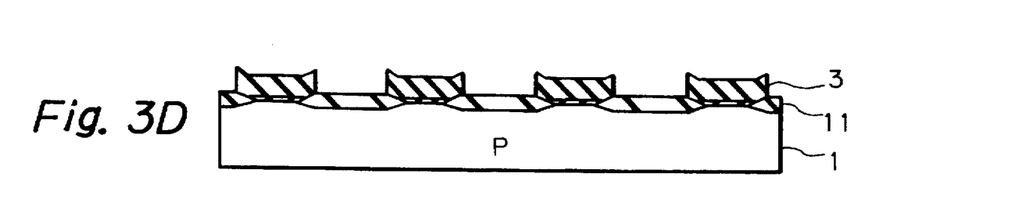

Next, referring to FIG. 3D, an about 0.2 to 0.5 μm thick field silicon oxide layer 11 is formed by thermally oxidizing the silicon substrate 1 using the silicon nitride layer 3 as a mask. This oxidizing process is called a local oxidation of silicon (LOCOS).

Next, referring to FIG. 3E, the silicon nitride layer 3 is etched by an anistropic etching process, and subsequently, the silicon oxide layer 2 on the active areas $A_1'$, $A_2'$, $A_3'$ and $A_4'$ are etched by diluted fluorine acid.

Figure 3E:
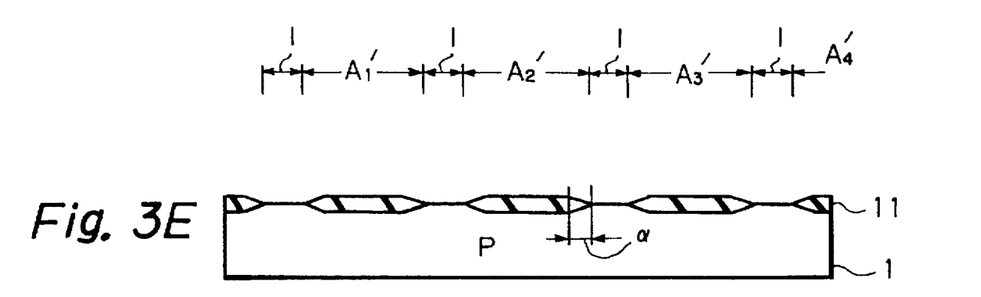
Figure 3F:
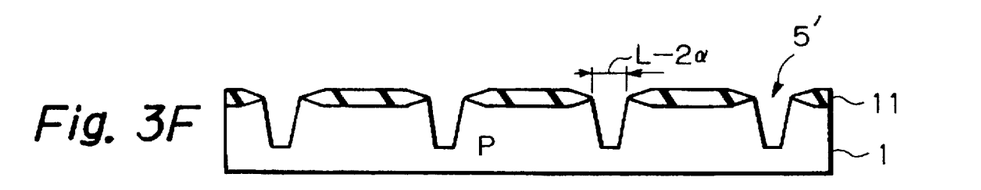

Next, referring to FIG. 3F, an anisotropic etching process by a mixture gas of chlorine and nitrogen is performed upon the silicon substrate 1 using the field silicon oxide layer 11 as a mask. As a result, grooves 5' having a depth of about 0.1 to 1.0 μm are formed in the silicon substrate 1. In this case, a width of the isolation area I' is represented by $$L - 2\alpha$$

where L is the minimum resolution dimension of the photoresist layer 4 of FIG. 3A; and α is a length of a bird beak of the silicon nitride layer 11 of FIG. 3E. Therefore, if L is 0.5 μm and α is 0.1 μm, then $$L - 2\alpha = 0.5\,\mu m - 2 \times 0.1\,\mu m$$
$$= 0.3\,\mu m$$

Thus, the width of the isolation area I' is reduced to 0.3 μm; in other words, the width of the isolation area I' is reduced by about 40% as compared with the width of the isolation area I of FIGS. 1A through 1E. Also, the depth of the grooves 5' is stable, since use is made of an anisotropic etching process. Further, when the selection ratio of the silicon substrate 1 to the field silicon oxide layer 11 in the anisotropic etching process is less than 10/1, edges of the bird beaks of the field silicon oxide layer 11 are etched simultaneously with etching of the silicon substrate 1, so that the grooves 5' have a tapered shape as illustrated in FIG. 3F.

Figure 3G:
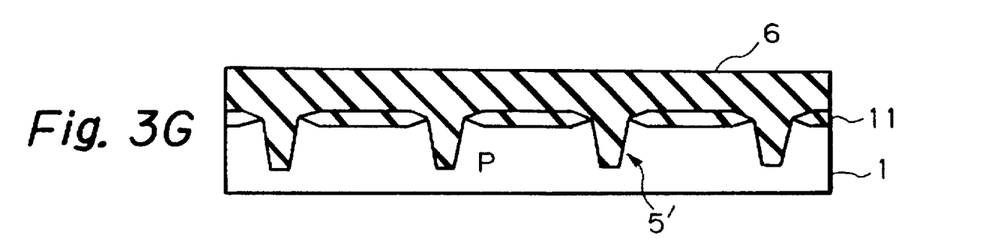

Next, referring to FIG. 3G, in a similar way to that in FIG. 1C, an about 0.4 to 2.0 μm thick BPSG layer 6 is formed by a CVD process on the entire surface, and is completely filled in the grooves 5'. Then, the BPSG layer 6 is flattened by an annealing process using water steam or nitrogen atmosphere at a temperature of about 800° to 1000° C. In this case, note that the BPSG layer 6 is smoothly buried into the grooves 5' due to the smooth slope of the bird beaks of the field silicon oxide layer 11 and the tapered shape of the grooves 5', thus preventing voids from generating in the BPSG layer 6 buried in the grooves 5'.

Figure 3H:
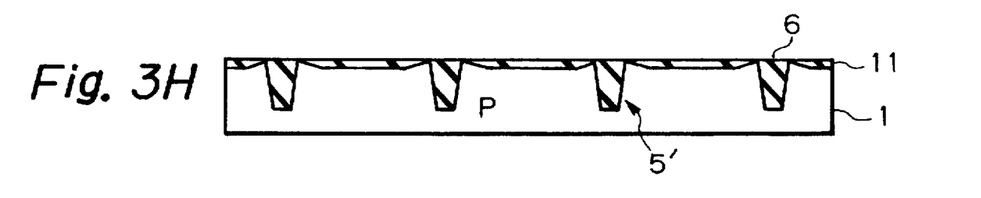

Next, referring to FIG. 3H, the BPSG layer 6 is etched back by a chemical mechanical polishing (CMP) process. In this case, note that a part of the field silicon oxide layer 11 is left on the silicon substrate 1, thus preventing the active areas $A_1'$, $A_2'$, $A_3'$ and $A_4'$ from being damaged by the CMP process.

Figure 3I:
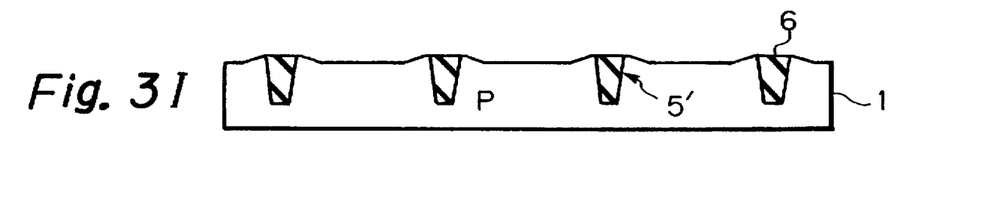

Finally, referring to FIG. 3I, the remainder field silicon oxide layer 11 is etched by diluted fluorine acid, so that the BPSG layer 6 remains only in the grooves 5'. In this case, since the etching rate of the BPSG layer 6 by diluted fluorine acid is much smaller than the etching rate of the field silicon oxide layer 11 by diluted fluorine acid, the BPSG layer 6 is hardly etched.

Thus, the active areas $A_1'$, $A_2'$, $A_3'$ and $A_4'$ are isolated from each other by the isolation area I' in which the groove-type BPSG layer 6 is formed.

FIGS. 4A through 4H illustrate a second embodiment of the present invention. In this second embodiment, a field silicon oxide layer is formed on a polycrystalline silicon layer.

Figure 4A:
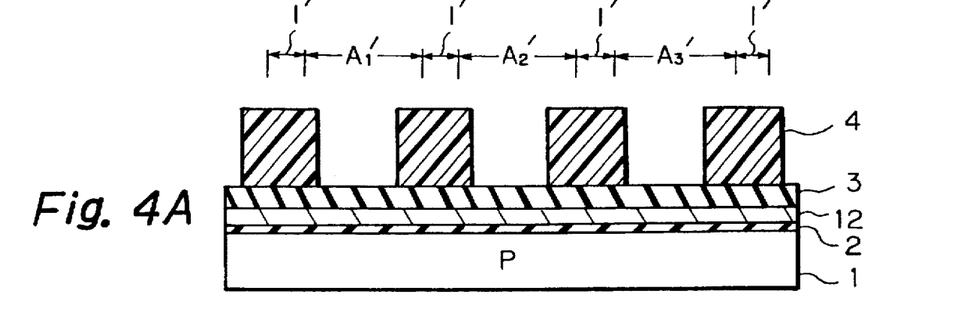
FIGS. 4A and 4I are cross-sectional view for showing a second embodiment of the method of manufacturing a semiconductor device according to the present invention.

First, referring to FIG. 4A, in a similar way to that in FIG. 3A, an about 50 to 200 Å thick silicon oxide layer 2 is formed by thermally oxidizing a P-type monocrystalline silicon substrate 1. Then, a polycrystalline silicon layer 12 is formed by a CVD process on the silicon oxide layer 2. Then, an about 0.1 to 0.3 μ m thick silicon nitride layer 3 is formed by a CVD process on the polycrystalline silicon layer 12. Then, a photoresist layer 4 is formed on the silicon nitride layer 3.

Also, as illustrated in FIG. 4A, openings for defining active areas $A_1'$, $A_2'$ and $A_3'$ are perforated in the photoresist layer 4 by a photolithography process.

Figure 4B:
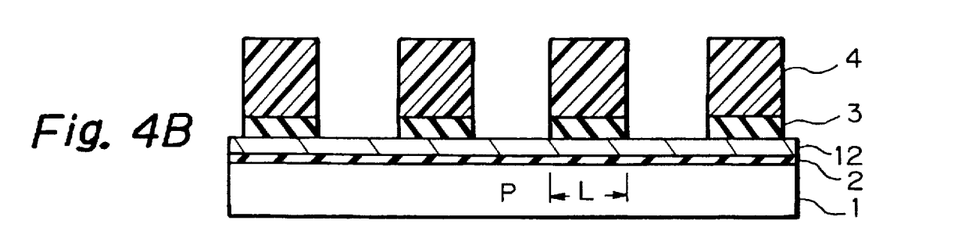

Next, referring to FIG. 4B, the silicon nitride layer 3 is etched by hot phosphoric acid using the photoresist layer 4 as a mask, and using the polycrystalline silicon layer 3 as an etching stopper.

Figure 4C:
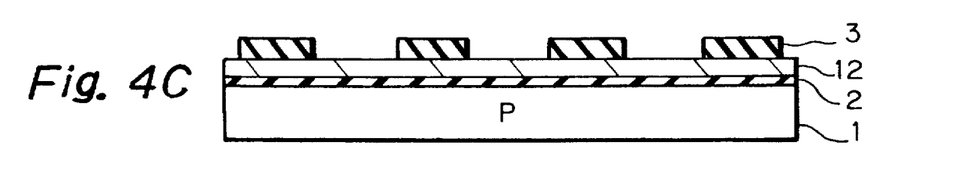

Next, referring to FIG. 4C, the photoresist layer 4 is removed.

Figure 4D:
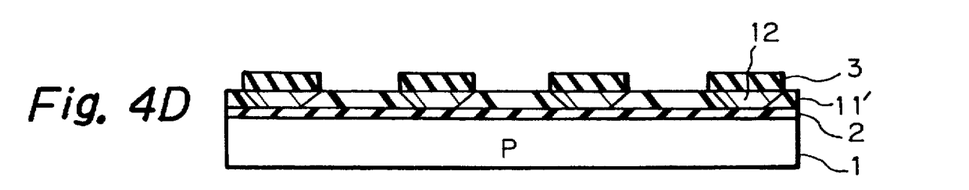

Next, referring to FIG. 4D, an about 0.2 to 0.5 μm thick field silicon oxide layer 11' is formed by thermally oxidizing the polycrystalline silicon layer 12 using the silicon nitride layer 3 as a mask. This oxidizing process is also called LOCOS.

Figure 4E:
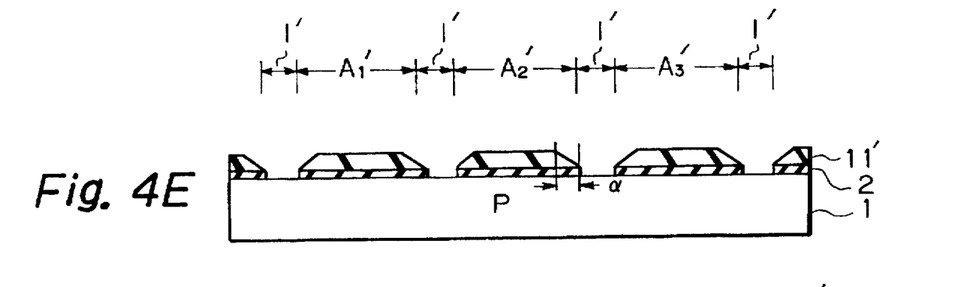

Next, referring to FIG. 4E, the silicon nitride layer 3 is etched by an anistropic etching process, and subsequently, the polycrystalline silicon layer 12 on the isolation area I' is etched by a dry etching process. Subsequently, the silicon oxide layer 2 in the isolation area I' is etched by diluted fluorine acid.

Figure 4F:
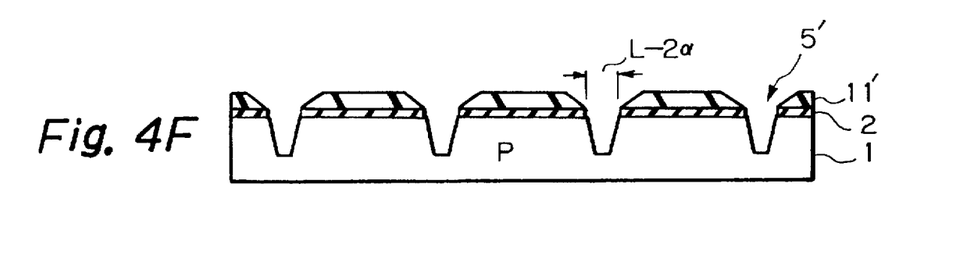

Next, referring to FIG. 4F, in the same way as in FIG. 3F, an anisotropic etching process by a mixture gas of chlorine and nitrogen is performed upon the silicon substrate 1 using the field silicon oxide layer 11 as a mask. As a result, grooves 5' having a depth of about 0.1 to 1.0μm are formed in the silicon substrate 1. Also, in this case, a width of the isolation area I' is represented by $$L - 2\alpha$$

Therefore, if L is 0.5 μm and α is 0.1 μm, then $$L - 2\alpha = 0.5\,\mu m - 2 \times 0.1\,\mu m$$
$$= 0.3\,\mu m$$

Thus, the width of the isolation area I' is reduced to 0.3 μm; in other words, the width of the isolation area I' is reduced by about 40% as compared with the width of the isolation area I of FIGS. 1A through 1E. Also, the depth of the grooves 5' is stable, since use is made of an anisotropic etching process. Further, when the selection ratio of the silicon substrate 1 to the field silicon oxide layer 11' in the anisotropic etching process is less than 10/1, edges of the bird beaks of the field silicon oxide layer 11' are etched simultaneously with etching of the silicon substrate 1, so that the grooves 5' have a tapered shape as illustrated in FIG. 4F.

Figure 4G:
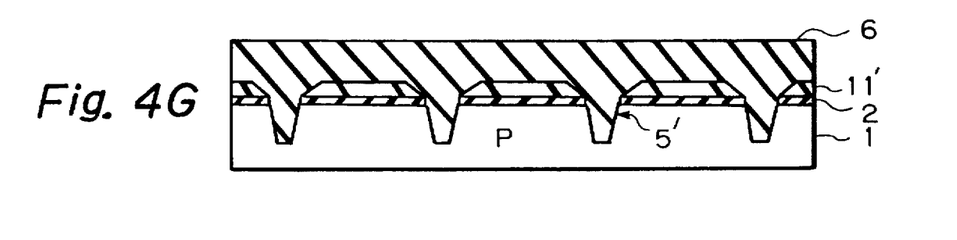

Next, referring to FIG. 4G, in the same way as in FIG. 3G, an about 0.4 to 2.0μm thick BPSG layer 6 is formed by a CVD process on the entire surface, and is completely filled in the grooves 5'. Then, the BPSG layer 6 is flattened by an annealing process using a water steam or nitrogen atmosphere at a temperature of about 800° to 1000° C. Also in this case, note that the BPSG layer 6 is smoothly buried into the grooves 5' due to the smooth slope of the bird beaks of the field silicon oxide layer 11' and the tapered shape of the grooves 5', thus preventing voids from generating in the BPSG layer 6 buried in the grooves 5'.

Figure 4H:
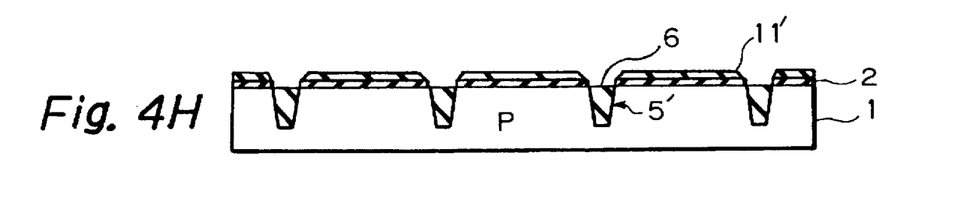

Next, referring to FIG. 4H, in a similar way as that in FIG. 3H, the BPSG layer 6 is etched back by a CMP process. In this case, note that a part of the field silicon oxide layer 11' is left on the silicon substrate 1, thus preventing the active areas $A_1'$, $A_2'$ and $A_3'$ from being damaged by the CMP process. Finally, referring to FIG. 4I, in a similar way to that in FIG. 3I, the remaining field silicon oxide layer 11' and the silicon oxide layer 2 are etched by diluted fluorine acid, so that the BPSG layer 6 remains only in the grooves 5'. Also in this case, since the etching rate of the BPSG layer 6 by diluted fluorine acid is much smaller than the etching rate of the field silicon oxide layer 11' by diluted fluorine acid, the BPSG layer 6 is hardly etched.

Figure 4I:
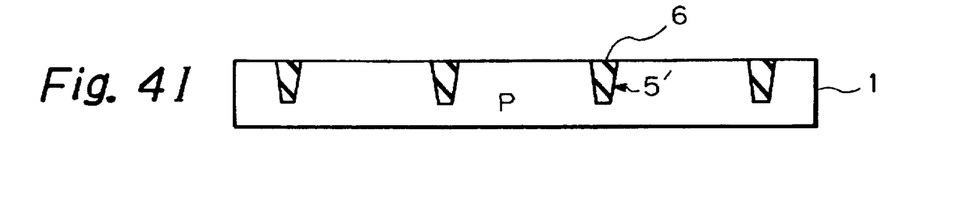

Thus, even in the second embodiment, the active areas $A_1'$, $A_2'$ and $A_3'$ are isolated from each other by the isolation area I'in which the groove-type BPSG layer 6 is formed.

Further, as illustrated in FIGS. 3I and 4I, since the silicon substrate 1 is not oxidized, the surface of the active areas is more flat than in the first embodiment.

As explained hereinbefore, according to the present invention, since a groove-type isolation area having a width smaller than a minimum resolution dimension determined by a photolithography process can be formed, active areas can be increased, thus enhancing the integration.

I claim:

1. A method for manufacturing a semiconductor device, comprising the steps of:

forming a first silicon oxide layer by thermally oxidizing a silicon substrate;

forming a silicon nitride layer on said first silicon oxide layer;

forming a photoresist pattern on said silicon nitride layer;

etching said silicon nitride layer using said photoresist pattern as a mask;

removing said photoresist pattern after said silicon nitride layer is etched;

forming a second silicon oxide layer having bird beaks on sides thereof by thermally oxidizing said silicon substrate using said silicon nitride layer as a mask;

removing said silicon nitride layer after said second silicon oxide layer is formed;

etching said silicon substrate and said second silicon oxide layer by an anisotropic etching process using a selection ratio of said silicon substrate to said second silicon oxide layer so that the bird beaks of said second silicon oxide layer are etched simultaneously with etching of said silicon substrate, thus forming a tapered groove in said silicon substrate, after said silicon nitride layer is removed;

forming an insulating layer on said second silicon oxide layer and said groove;

etching back said insulating layer so that said insulating layer remains in said groove; and selectively etching second silicon oxide layer.

2. The method as set forth in claim 1, wherein said selection ratio is less than 10/1.

3. The method as set forth in claim 1, wherein aid anisotropic etching process uses a mixture gas of chlorine and nitrogen.

4. The method as set forth in claim 1, wherein said etching-back step uses CMP process.

5. The method as set forth in claim 1, wherein said insulating layer is made of BPSG, said selective etching process using diluted fluorine acid.

6. A method for manufacturing a semiconductor device, comprising the steps of:

forming a first silicon oxide layer by thermally oxidizing a silicon substrate;

forming a polycrystalline silicon layer on said first silicon oxide layer;

forming a silicon nitride layer on said polycrystalline silicon layer;

forming a photoresist pattern on said silicon nitride layer;

etching said silicon nitride layer using said photoresist pattern as a mask;

removing said photoresist pattern after said silicon nitride layer is etched;

forming a second silicon oxide layer having bird beaks on sides thereof by thermally oxidizing said polycrystalline silicon layer using said silicon nitride layer as a mask;

removing said silicon nitride layer and said polycrystalline silicon layer after said second silicon oxide layer is formed;

etching said silicon substrate and said second silicon oxide layer by an anisotropic etching process using a selection ratio of said silicon substrate to said second silicon oxide layer so that the bird beaks of said second silicon oxide layer are etched simultaneously with etching of said silicon substrate, thus forming a tapered groove in said silicon substrate, after said silicon nitride layer and said polycrystalline silicon layer are removed;

forming an insulating layer on said second silicon oxide layer and said groove;

etching back said insulating layer so that said insulating layer remains in said groove; and selectively etching second silicon oxide layer and said first silicon oxide layer.

7. The method as set forth in claim 6, wherein said selection ratio is less than 10/1.

8. The method as set forth in claim 6, wherein said anisotropic etching process uses a mixture gas of chlorine and nitrogen.

9. The method as set forth in claim 6, wherein said etching-back step uses CMP process.

10. The method as set forth in claim 6, wherein said insulating layer is made of BPSG, said selective etching process using diluted fluorine acid.

* * * * *